United States Patent
Hahakura et al.

(10) Patent No.: US 8,216,979 B2
(45) Date of Patent: *Jul. 10, 2012

(54) METHOD OF MANUFACTURING SUPERCONDUCTING THIN FILM MATERIAL, SUPERCONDUCTING DEVICE AND SUPERCONDUCTING THIN FILM MATERIAL

(75) Inventors: Shuji Hahakura, Osaka (JP); Kazuya Ohmatsu, Osaka (JP); Munetsugu Ueyama, Osaka (JP); Katsuya Hasegawa, Osaka (JP)

(73) Assignees: Sumitomo Electric Industries, Ltd., Osaka-shi, Osaka (JP); International Superconducticvity Technology Center, Koto-ku, Tokyo (JP)

( * ) Notice: Subject to any disclaimer, the term of this patent is extended or adjusted under 35 U.S.C. 154(b) by 926 days.

This patent is subject to a terminal disclaimer.

(21) Appl. No.: 12/278,369

(22) PCT Filed: Jan. 17, 2007

(86) PCT No.: PCT/JP2007/050592
§ 371 (c)(1),
(2), (4) Date: Aug. 5, 2008

(87) PCT Pub. No.: WO2007/094146
PCT Pub. Date: Aug. 23, 2007

(65) Prior Publication Data
US 2009/0239753 A1 Sep. 24, 2009

(30) Foreign Application Priority Data
Feb. 16, 2006 (JP) .................. 2006-039395

(51) Int. Cl.
*B05D 5/12* (2006.01)
*H01B 12/00* (2006.01)
*H01L 39/24* (2006.01)

(52) U.S. Cl. ........ 505/473; 505/470; 505/234; 505/150; 427/62; 427/126.2; 428/472; 428/701

(58) Field of Classification Search .................. 505/150, 505/234, 446, 470, 473, 475, 732, 734; 427/62, 427/126.2, 255.19
See application file for complete search history.

(56) References Cited

U.S. PATENT DOCUMENTS 6,223,418 B1   5/2001   Han
6,743,533 B1 *   6/2004   Kakimoto et al. ............ 428/701
(Continued)

FOREIGN PATENT DOCUMENTS
JP   1-100815   4/1989
(Continued)

*Primary Examiner* — Stanley Silverman
*Assistant Examiner* — Kallambella Vijayakumar
(74) *Attorney, Agent, or Firm* — Drinker Biddle & Reath LLP

(57) ABSTRACT

A method of manufacturing a superconducting thin film material includes a vapor phase step of forming a superconducting layer by a vapor phase method and a liquid phase step of forming a superconducting layer by a liquid phase method so that the latter superconducting layer is in contact with the former superconducting layer. Preferably, the method further includes the step of forming an intermediate layer between the former superconducting layer and a metal substrate. The metal substrate is made of a metal, and preferably the intermediate layer is made of an oxide having a crystal structure of any of rock type, perovskite type and pyrochlore type, and the former superconducting layer and the latter superconducting layer both have an RE123 composition. Accordingly, the critical current value can be improved.

2 Claims, 7 Drawing Sheets

U.S. PATENT DOCUMENTS

| | | | |
|---|---|---|---|
| 7,858,558 B2 * | 12/2010 | Hahakura et al. | 505/234 |
| 2006/0014304 A1 * | 1/2006 | Hahakura et al. | 438/2 |

FOREIGN PATENT DOCUMENTS

| | | | |
|---|---|---|---|
| JP | 2002-75079 | | 3/2002 |
| JP | 2003-323822 | | 11/2003 |
| JP | 2004-39442 | | 2/2004 |
| JP | 2002-075079 | * | 3/2005 |
| JP | 2005-93205 | | 4/2005 |
| JP | 2005-093205 | * | 4/2005 |
| KR | 2002-0046961 | | 6/2002 |
| RU | 2 032 765 | | 4/1995 |
| RU | 2 043 981 | | 9/1995 |
| RU | 2 133 525 | | 7/1999 |
| RU | 2 183 875 | | 6/2002 |
| WO | WO 2005/029512 A | * | 3/2005 |

* cited by examiner (a) → (b)

METHOD OF MANUFACTURING SUPERCONDUCTING THIN FILM MATERIAL, SUPERCONDUCTING DEVICE AND SUPERCONDUCTING THIN FILM MATERIAL

TECHNICAL FIELD

The present invention relates to a method of manufacturing a superconducting thin film material, a superconducting device and a superconducting thin film material. More specifically, the invention relates to a method of manufacturing a superconducting thin film material having an RE123 composition, a superconducting device and a superconducting thin film material.

BACKGROUND ART

Two types of superconducting wires: a superconducting wire using a bismuth-based superconductor and a superconducting wire using an RE123-based superconductor are now being particularly developed. Of these wires, the RE123-based superconducting wire has the advantage that the critical current density at the liquid nitrogen temperature (77.3 K) is higher than that of the bismuth-based superconducting wire. Additionally, it has the advantage of a high critical current value under a low temperature condition and under a certain magnetic field condition. Therefore, the RE123-based superconducting wire is expected as a next generation high-temperature superconducting wire.

Unlike the bismuth-based superconductor, the RE123-based superconductor cannot be covered with a silver sheath. Therefore, the RE123-based superconductor is manufactured by depositing a film of a superconductor (superconducting thin film material) on a textured metal substrate by a vapor phase method only or a liquid phase method only.

Japanese Patent Laying-Open No. 2003-323822 (Patent Document 1) for example discloses a method of manufacturing a conventional RE123-based superconducting thin film material. Patent Document 1 discloses the technique of forming an intermediate layer on a metal tape substrate using the pulsed laser deposition (PLD) method, forming a first superconducting layer having an RE123 composition on the intermediate layer using the PLD method, and forming a second superconducting layer having an RE123 composition on the first superconducting layer using the pulsed laser deposition method.

Patent Document 1: Japanese Patent Laying-Open No. 2003-323822

DISCLOSURE OF THE INVENTION

Problems to be Solved by the Invention

In order to increase the critical current value of the superconducting wire, the thickness of the superconducting thin film material may be increased to enlarge the cross-sectional area where the current flows. The conventional superconducting wire, however, has the following property. As the thickness of the superconducting thin film material increases, the critical current density decreases and the critical current value becomes gradually slow to increase. The resultant problem is therefore that the critical current density and the critical current value cannot be improved.

Another problem is that the method of depositing the superconducting thin film material on the textured metal substrate using only the liquid phase method hinders crystal growth of the superconducting thin film material.

An object of the present invention is therefore to provide a method of manufacturing a superconducting thin film material, a superconducting device and a superconducting thin film material for which the critical current density and the critical current value can be improved.

Another object of the present invention is to provide a method of manufacturing a superconducting thin film material, a superconducting device and a superconducting thin film material for which crystal growth of the superconducting thin film material is facilitated.

Means for Solving the Problems

A method of manufacturing a superconducting thin film material according to one aspect of the present invention includes: a vapor phase step of forming a vapor phase growth superconducting layer by a vapor phase method; and a liquid phase step of forming a liquid phase growth superconducting layer by a liquid phase method so that the liquid phase growth superconducting layer is in contact with the vapor phase growth superconducting layer.

A method of manufacturing a superconducting thin film material according to another aspect of the present invention includes: n vapor phase steps (n is an integer of at least 2) each for forming a vapor phase growth superconducting layer by a vapor phase method; and n liquid phase steps each for forming a liquid phase growth superconducting layer by a liquid phase method. In a first vapor phase step of the n vapor phase steps, a first vapor phase growth superconducting layer is formed. In a first liquid phase step of the n liquid phase steps, a first liquid phase growth superconducting layer is formed so that the first liquid phase growth superconducting layer is in contact with the first vapor phase growth superconducting layer. In a k-th vapor phase step (k is an integer satisfying $n \geq k \geq 2$) of the n vapor phase steps, a k-th vapor phase growth superconducting layer is formed so that the k-th vapor phase growth superconducting layer is in contact with a (k−1)-th liquid phase growth superconducting layer. In a k-th liquid phase step of the n liquid phase steps, a k-th liquid phase growth superconducting layer is formed so that the k-th liquid phase growth superconducting layer is in contact with the k-th vapor phase growth superconducting layer.

The inventors of the present application found that the smoothness of the surface of the superconducting thin film material as well as the compactness of the crystal of the superconducting thin film material are important factors for preventing decrease of the critical current density due to increase of the film thickness. Regarding the vapor phase method, as the thickness of a film as formed increases, the temperature of the surface where the film is formed decreases, resulting in a phenomenon that the number of a-axis oriented particles is relatively larger. Therefore, a conventional superconducting thin film material formed by only the vapor phase method has its surface smoothness that is deteriorated as the film thickness increases. Regarding the liquid phase method, as the thickness of a film as formed increases (particularly a thickness exceeding 1 μm), the compactness of the crystal of the superconducting thin film material deteriorates. Therefore, it is the conventional case that a desired critical current density and a desired critical current value cannot be obtained even if the thickness of the superconducting thin film material is increased.

Therefore, according to the method of manufacturing a superconducting thin film material of the present invention, a vapor phase growth superconducting layer is formed by a vapor phase method, and a liquid phase growth superconducting layer is formed by a liquid phase method so that the liquid phase superconducting layer is in contact with the vapor phase growth superconducting layer. Thus, in the process of forming the liquid phase growth superconducting layer, the liquid fills the uneven surface of the vapor phase growth superconducting layer and the crystal growth of the liquid phase growth superconducting layer occurs on a seed which is the surface of the vapor phase growth superconducting layer. Therefore, the unevenness of the surface of the vapor phase growth superconducting layer is smoothed. Further, since the superconducting thin film material is constituted of both of the vapor phase growth superconducting layer and the liquid phase growth superconducting layer, each of the vapor phase growth superconducting layer and the liquid phase growth superconducting layer can be made thinner as compared with the case where the superconducting thin film material is constituted of only one of the vapor phase growth superconducting layer and the liquid phase growth superconducting layer. In this way, the unevenness of the surface of the superconducting thin film material is smoothed and deterioration of the compactness of the crystal of the superconducting thin film material can be prevented. As a result, the thickness of the superconducting thin film material can be increased while the smoothness of the surface of the superconducting thin film material and the compactness of the crystal of the superconducting thin film material are excellent. Therefore, decrease of the critical current density due to an increased film thickness can be prevented and the critical current density and the critical current value can be improved.

In the initial stage of the growth of the liquid phase growth superconducting layer by a liquid phase method, a layer serving as a seed of the crystal growth is necessary. Regarding the conventional method of depositing a superconducting thin film material using a liquid phase method only, there is no layer serving as a seed of the crystal growth, which means that the crystal growth is somewhat hindered. In contrast, regarding the manufacturing method of the present invention, the vapor phase growth superconducting layer serves as a seed of the crystal growth, which facilitates the crystal growth of the superconducting thin film material.

In addition, regarding the method of manufacturing a superconducting thin film material in the aforementioned another aspect of the present invention, the superconducting thin film material is manufactured by alternately performing the step of forming a vapor phase growth superconducting layer and the step of forming a liquid phase growth superconducting layer and performing each step multiple times. Therefore, the total thickness of the superconducting layer can be increased while each vapor phase growth superconducting layer and each liquid phase growth superconducting layer are kept thin. In this way, the critical current value can further be increased.

According to the method of manufacturing a superconducting thin film material in the aforementioned one aspect of the present invention, preferably the vapor phase growth superconducting layer is formed on a front surface side of a substrate in the vapor phase step. The method further includes: a rear surface side vapor phase step of forming a rear surface side vapor phase growth superconducting layer by a vapor phase method on a rear surface side of the substrate; and a rear surface side liquid phase step of forming a rear surface side liquid phase growth superconducting layer by a liquid phase method so that the rear surface side liquid phase growth superconducting layer is in contact with the rear surface side vapor phase growth superconducting layer.

In this way, respective superconducting thin film materials can be formed on both sides of the substrate, and thus the number of current paths of the superconducting wire can be increased and the critical current density and the critical current value can further be improved.

It should be noted that "front surface of the substrate" and "rear surface of the substrate" are merely used for distinguishing two main surfaces of the substrate from each other, and the front surface may be any one of the two main surfaces.

According to the method of manufacturing a superconducting thin film material in the aforementioned one aspect of the present invention, preferably the vapor phase growth superconducting layer is formed on a front surface side of a substrate in the vapor phase step. The method further includes the step of forming an intermediate layer between the vapor phase growth superconducting layer and the substrate. The substrate is made of a metal, the intermediate layer is made of an oxide having a crystal structure of one of rock type, perovskite type and pyrochlore type, and the vapor phase growth superconducting layer and the liquid phase growth superconducting layer each have an RE123 composition.

According to the method of manufacturing a superconducting thin film material in the aforementioned another aspect of the present invention, preferably a first vapor phase growth superconducting layer is formed on a front surface side of a substrate in a first vapor phase step. The method further includes the step of forming an intermediate layer between the first vapor phase growth superconducting layer and the substrate. The substrate is made of a metal, the intermediate layer is made of an oxide having a crystal structure of one of rock type, perovskite type and pyrochlore type, and the first to n-th vapor phase growth superconducting layers and the first to n-th liquid phase growth superconducting layers each have an RE123 composition.

In this way, the superconducting thin film material excellent in crystal orientation and surface smoothness can be obtained and the critical current density and the critical current value can be improved.

According to the method of manufacturing a superconducting thin film material in the aforementioned one aspect of the present invention, preferably the method further includes the step of forming a superconducting layer after the liquid phase step, so that the superconducting layer is in contact with the liquid phase growth superconducting layer.

According to the method of manufacturing a superconducting thin film material in the aforementioned another aspect of the present invention, preferably the method further includes the step of forming a superconducting layer after the n-th liquid phase step so that the superconducting layer is in contact with the n-th liquid phase growth superconducting layer.

The superconducting layer that is grown by a liquid phase method is superior in surface smoothness to the superconducting layer grown by a vapor phase method. Therefore, the superconducting layer can be formed on the superconducting layer which is excellent in surface smoothness.

According to the manufacturing method as described above, preferably the vapor phase method is any of laser deposition method, sputtering method and electron beam evaporation method.

According to the manufacturing method as described above, the liquid phase method is metal organic deposition (MOD) method. Thus, the superconducting thin film material excellent in crystal orientation and surface smoothness can be obtained and the critical current density and the critical current value can be improved.

A superconducting device according to the present invention uses a superconducting thin film material manufactured by the method of manufacturing a superconducting thin film material as described above.

With the superconducting device of the present invention, the critical current density and the critical current value can be improved.

A superconducting thin film material of the present invention includes a first superconducting layer and a second superconducting layer formed to be in contact with the first superconducting layer, and has a critical current value larger than 110 (A/cm-width).

It should be noted that "RE123" herein refers to $RE_xBa_yCu_zO_{7-d}$ where $0.7 \leq x \leq 1.3$, $1.7 \leq y \leq 2.3$, $2.7 \leq z \leq 3.3$. RE of "RE123" refers to a material including at least any of a rare earth element and an yttrium element. The rare earth element includes for example neodymium (Nd), gadolinium (Gd), holmium (Ho) and samarium (Sm).

Effects of the Invention

With a method of manufacturing a superconducting thin film material, a superconducting device and a superconducting thin film material of the present invention, the critical current density and the critical current value can be improved.

DESCRIPTION OF THE REFERENCE SIGNS 1 metal substrate, 1a front surface, 1b rear surface, 2 intermediate layer, 3-9 superconducting layer, 10 superconducting thin film material

BEST MODES FOR CARRYING OUT THE INVENTION

In the following, embodiments of the present invention will be described based on the drawings.

First Embodiment

Figure 1:
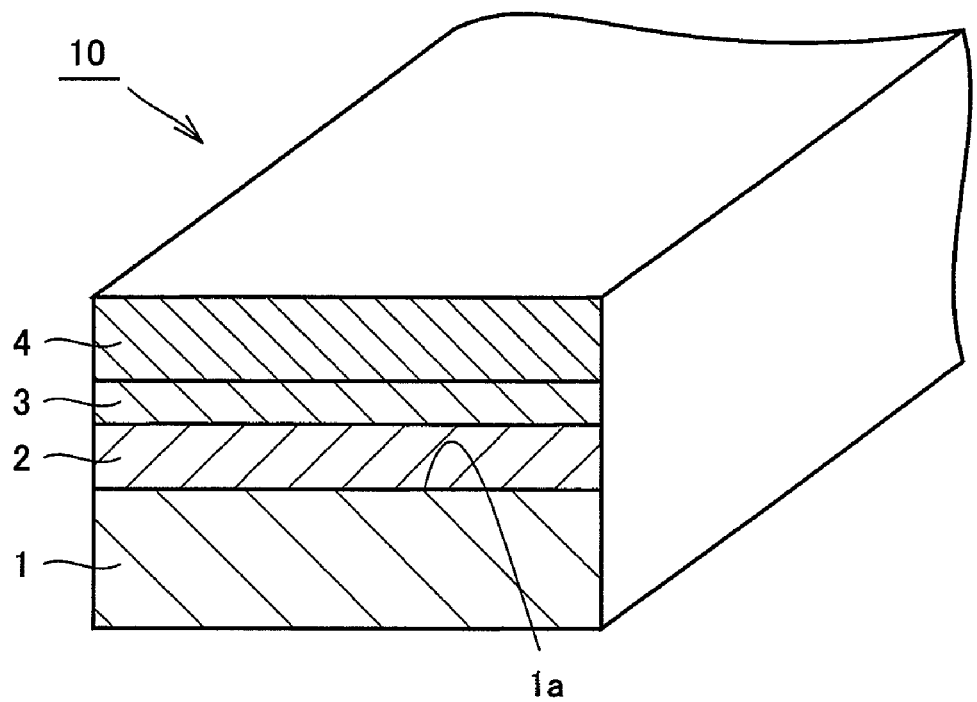
FIG. 1 is a partial cross-sectional perspective view schematically showing a structure of a superconducting thin film material in a first embodiment of the present invention.

FIG. 1 is a partial cross-sectional perspective view schematically showing a structure of a superconducting thin film material in a first embodiment of the present invention. Referring to FIG. 1, superconducting thin film material 10 in the present embodiment is tape-shaped, and includes a metal substrate 1, an intermediate layer 2, a superconducting layer 3 which is a vapor phase growth superconducting layer (first superconducting layer), and a superconducting layer 4 which is a liquid phase growth superconducting layer (second superconducting layer). Superconducting thin film material 10 is used for such devices as superconducting device for example.

Metal substrate 1 is made of a metal such as stainless, nickel alloy (Hastelloy for example) or silver alloy for example.

Intermediate layer 2 is formed on a front surface 1a of metal substrate 1 and functions as a diffusion preventing layer. Intermediate layer 2 is made of an oxide having a crystal structure which is any of rock type, perovskite type and pyrochlore type for example. Specifically, intermediate layer 2 is made of a material such as ceric oxide, yttria stabilized zirconia (YSZ), magnesium oxide, yttrium oxide, ytterbium oxide or barium zirconia, for example.

Superconducting layer 3 and superconducting layer 4 are layered on intermediate layer 2. Superconducting layer 3 and superconducting layer 4 are made of substantially the same material and have an RE123 composition for example.

Although the structure including intermediate layer 2 is described in connection with FIG. 1, intermediate layer 2 may not be included.

A method of manufacturing a superconducting thin film material in the present embodiment will now be described.

Figure 2:
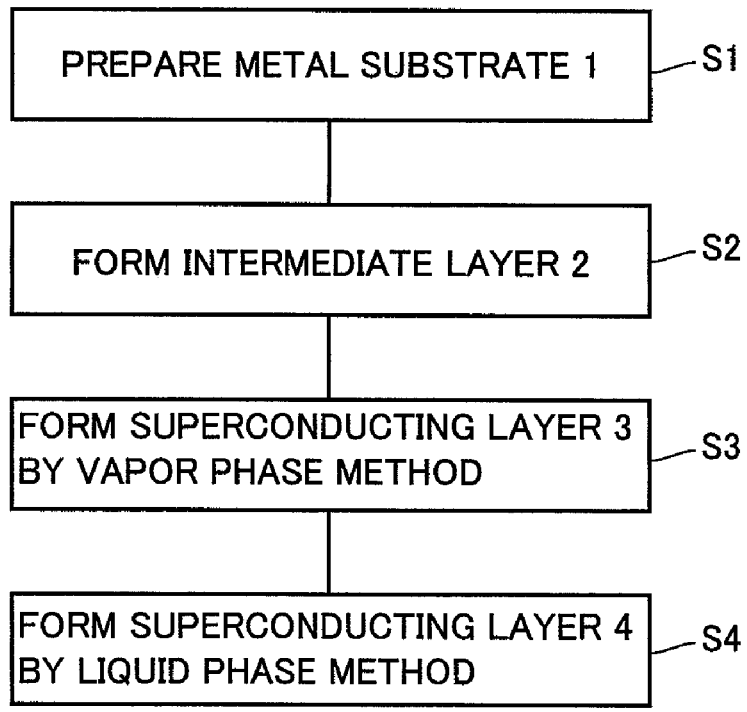
FIG. 2 is a flowchart showing a method of manufacturing the superconducting thin film material in the first embodiment of the present invention.

FIG. 2 is a flowchart showing the method of manufacturing the superconducting thin film material in the first embodiment of the present invention. Referring to FIGS. 1 and 2, according to the method of manufacturing the superconducting thin film material in the present embodiment, metal substrate 1 is prepared first (step S1), intermediate layer 2 made of YSZ for example is formed on front surface 1a of metal substrate 1 by the laser deposition method (step S2). Then, on intermediate layer 2, superconducting layer 3 having an RE123 composition for example is formed by a vapor phase method (step S3). As the vapor phase method for forming superconducting layer 3, the laser deposition method, sputtering method or electron beam evaporation method for example is used. Subsequently, superconducting layer 4 having an RE123 composition for example is formed by a liquid phase method such as MOD method so that superconducting layer 4 is in contact with superconducting layer 3 (step S4). Through the above-described steps, superconducting thin film material 10 is completed.

In the case where intermediate layer 2 is not included, the step of forming intermediate layer 2 (step S2) as described above is not performed. Instead, in the step of forming superconducting layer 3 (step S3), superconducting layer 3 is formed to be in contact with front surface 1a of metal substrate 1.

Figure 3:
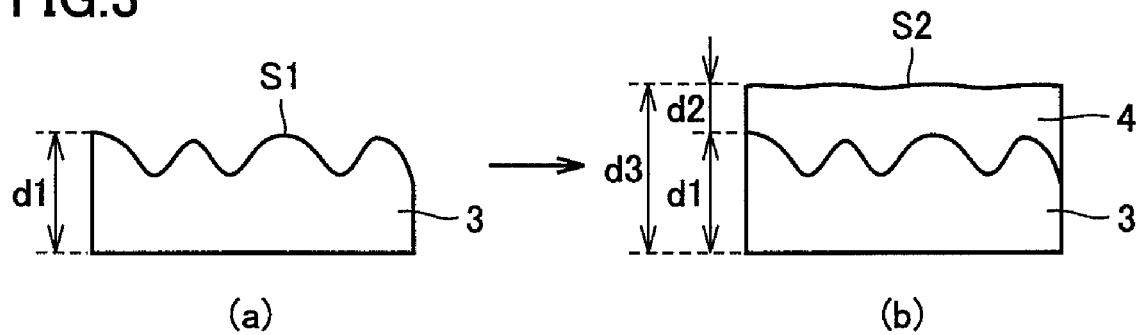
FIG. 3 schematically shows a manner in which a superconducting layer is formed in the first embodiment of the present invention.

FIG. 3 schematically shows a manner in which the superconducting layer in the first embodiment of the present invention is formed. Referring to FIG. 3 (a), according to superconducting thin film material 10 and the method of manufacturing thereof in the present embodiment, superconducting layer 3 is formed by the vapor phase method. Therefore, if a film thickness d1 of superconducting layer 3 is large, a surface S1 of the superconducting layer is uneven in some cases. However, referring to FIG. 3 (b), in the process of forming superconducting layer 4 by the liquid phase method, the solution containing components of superconducting layer 4 fills the uneven surface, and crystal growth of superconducting layer 4 occurs on the seed which is surface S1 of superconducting layer 3. In this way, a smoothed surface S2 is obtained. Referring to FIG. 3 (a), (b), the sum of film thickness d1 of superconducting layer 3 and film thickness d2 of superconducting layer 4 is thickness d3 of the superconducting thin film material. Therefore, film thickness d3 of the superconducting thin film material can be made larger without considerably increasing film thickness d1 of superconducting layer 3 and film thickness d2 of superconducting layer 4. Thus, the smoothness of surface S1 of superconducting layer 3 can be kept and the compactness of the crystal of superconducting layer 4 can be prevented from deteriorating. As a result, in the state where the smoothness of surface S2 of the superconducting thin film material as well as the compactness of the crystal of the superconducting thin film material are satisfactory, the thickness of the superconducting thin film material can be increased. Therefore, decrease of the critical current density due to increase of the film thickness can be prevented, and the critical current density and the critical current value can be improved.

Further, in the process of forming superconducting layer 4 by the liquid phase method, superconducting layer 3 serves as the seed of the crystal growth. Therefore, the crystal growth of the superconducting thin film material is facilitated.

Intermediate layer 2 made of an oxide having a crystal structure which is any of the rock type, perovskite type and pyrochlore type is formed between superconducting layer 3 and metal substrate 1, and superconducting layer 3 and superconducting layer 4 both have an RE123 composition. Therefore, the superconducting thin film material that has excellent surface smoothness and excellent crystal compactness can be obtained, and the critical current density and the critical current value can be improved.

Since the vapor phase method is any of the laser deposition method, sputtering method and electron beam evaporation method, the superconducting thin film material having excellent surface smoothness and excellent crystal compactness can be obtained, and the critical current density and the critical current value can be improved.

Since the liquid phase method is the MOD method, the superconducting thin film material having excellent surface smoothness and excellent crystal compactness can be obtained, and the critical current density and the critical current value can be improved.

Figure 4:
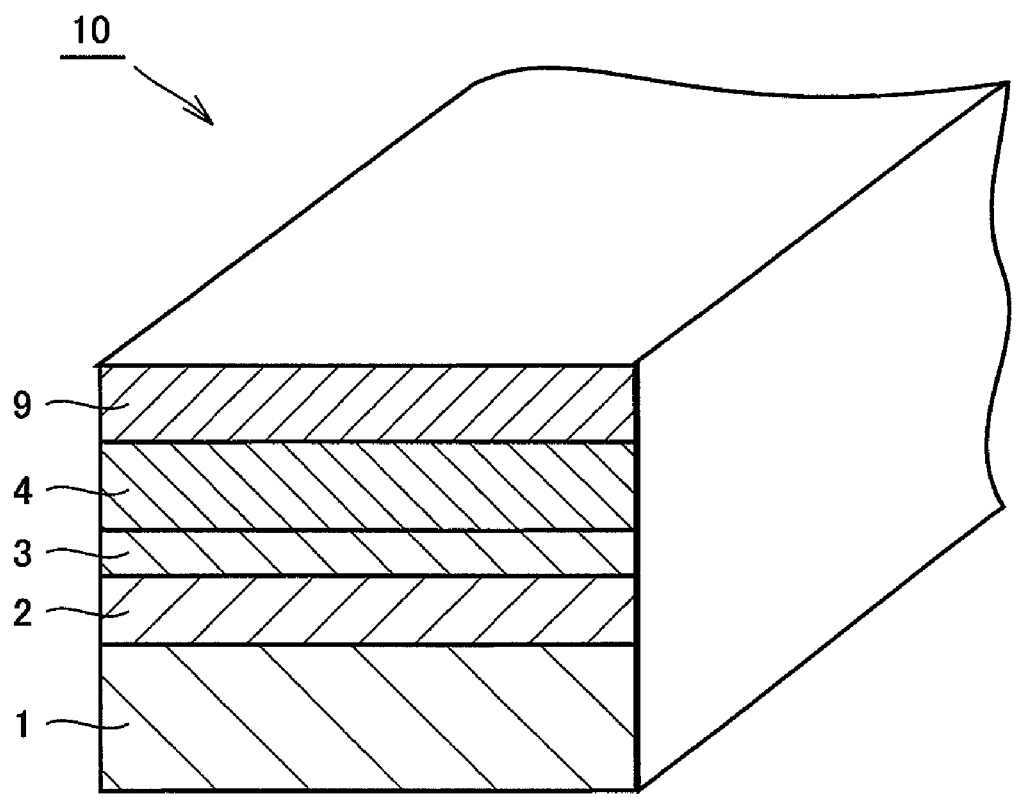
FIG. 4 is a partial cross-sectional perspective view schematically showing a structure of another superconducting thin film material in the first embodiment of the present invention.

In the present embodiment, the case is illustrated where the uppermost layer among layers constituting the superconducting thin film material is superconducting layer 4. As shown in FIG. 4, another superconducting layer 9 may be formed to be in contact with superconducting layer 4 after superconducting layer 4 is formed (step S4). This superconducting layer 9 may be formed by a vapor phase method or formed by a liquid phase method. Accordingly, on superconducting layer 4 having excellent surface smoothness, another superconducting layer 9 is formed so that the superconducting thin film material can be thickened.

Second Embodiment

Figure 5:
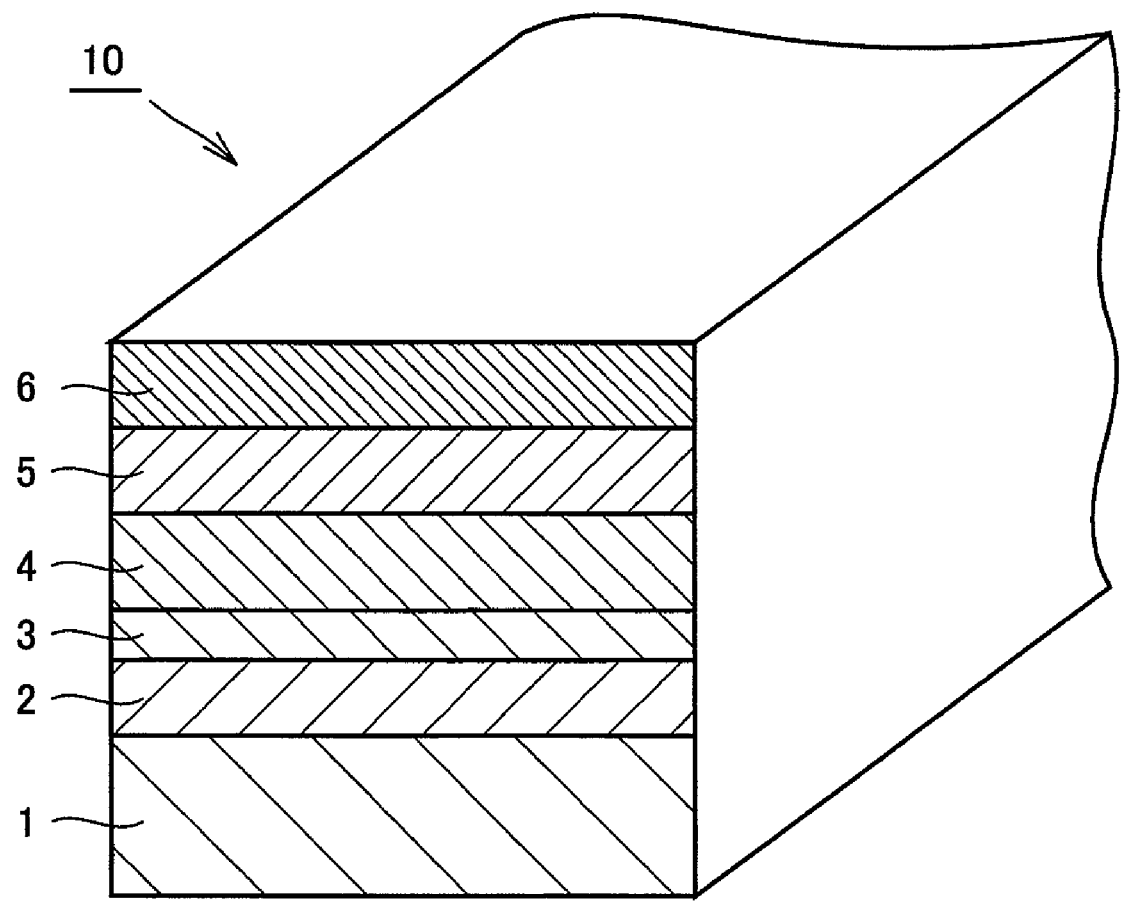
FIG. 5 is a partial cross-sectional perspective view schematically showing a structure of a superconducting thin film material in a second embodiment of the present invention.

FIG. 5 is a partial cross-sectional perspective view schematically showing a structure of a superconducting thin film material in a second embodiment of the present invention. Referring to FIG. 5, superconducting thin film material 10 in the present embodiment includes a metal substrate 1, an intermediate layer 2, a superconducting layer 3 which is a first vapor phase growth superconducting layer and a superconducting layer 4 which is a first liquid phase growth superconducting layer, and additionally includes a superconducting layer 5 which is a second vapor phase growth superconducting layer and a superconducting layer 6 which is a second liquid phase growth superconducting layer.

Superconducting layer 5 and superconducting layer 6 are layered on superconducting layer 4. Superconducting layer 5 and superconducting layer 6 are made of substantially the same material, and have an RE123 composition for example.

A method of manufacturing the superconducting thin film material in the present embodiment is now described.

Figure 6:
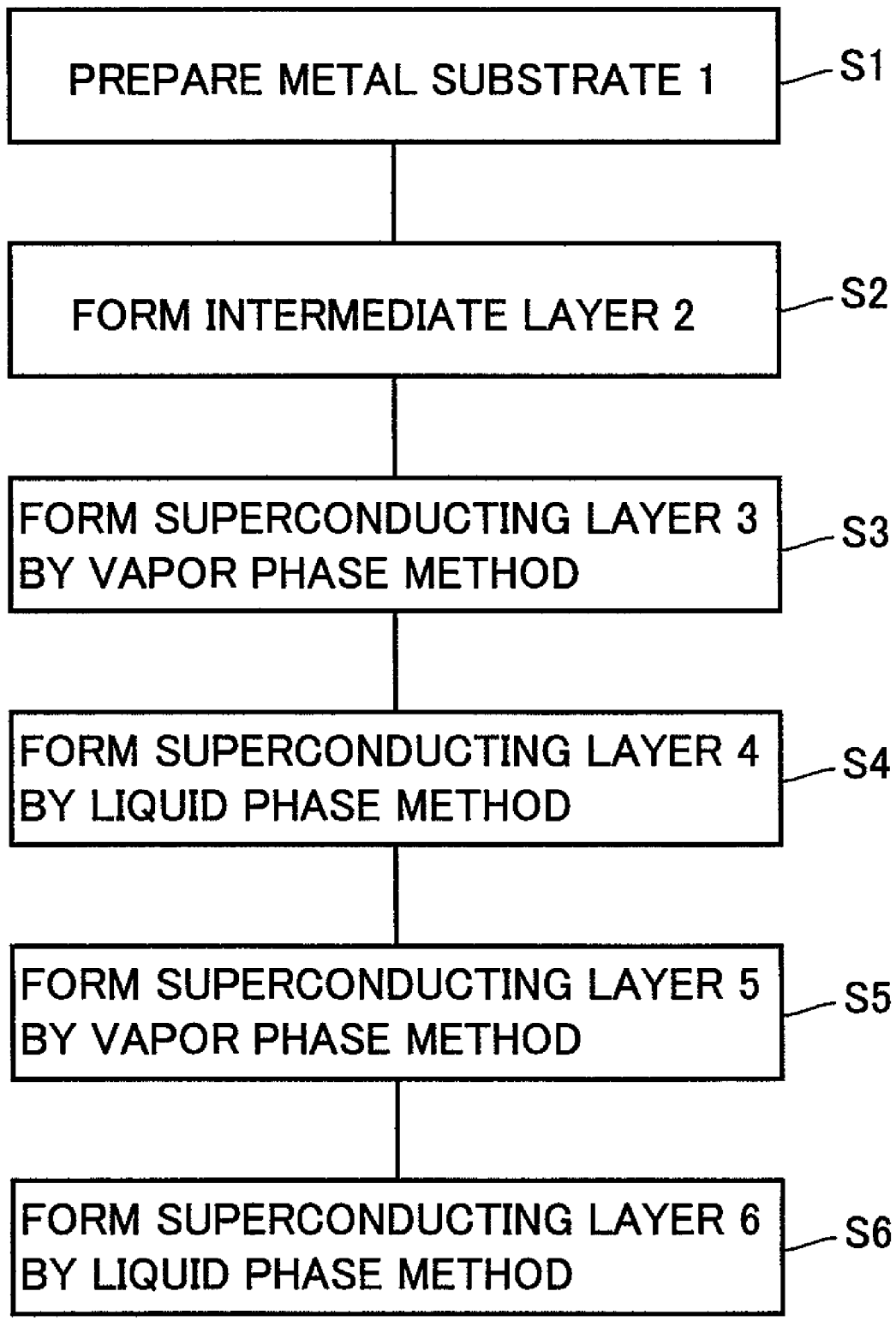
FIG. 6 is a flowchart showing a method of manufacturing the superconducting thin film material in the second embodiment of the present invention.

FIG. 6 is a flowchart showing the method of manufacturing the superconducting thin film material in the second embodiment of the present invention. Referring to FIGS. 5 and 6, according to the method of manufacturing the superconducting thin film material in the present embodiment, after superconducting layer 4 is formed (step S4), superconducting layer 5 having an RE123 composition for example is formed by a vapor phase method so that superconducting layer 5 is in contact with superconducting layer 4 (step S5). The vapor phase method used for forming superconducting layer 5 is, for example, laser deposition method, sputtering method or electron beam evaporation method. Subsequently, superconducting layer 6 having an RE123 composition for example is formed by a liquid phase method such as MOD so that superconducting layer 6 is in contact with superconducting layer 5 (step S6). Through the above-described steps, superconducting thin film material 10 is completed.

Any features other than the above-described ones of superconducting thin film material 10 and the manufacturing method thereof are similar to those of the superconducting thin film material and the manufacturing method thereof in the first embodiment as shown in FIGS. 1 and 2. Therefore, like components are denoted by like reference characters, and the description will not be repeated.

Regarding superconducting thin film material 10 and the manufacturing method thereof in the present embodiment, those effects similar to the effects of the superconducting thin film material and the manufacturing method thereof in the first embodiment can be achieved. In addition, the formation of the superconducting layer by the vapor phase method and the formation of the superconducting layer by the liquid phase method are performed alternately and each performed twice to manufacture the superconducting thin film material. Therefore, the thickness of the superconducting thin film material can be increased while the thickness of each of superconducting layers 3 to 6 is kept thin. Accordingly, the critical current value can further be increased.

In connection with the present embodiment, the case is illustrated where the two vapor phase steps of forming respective vapor phase growth superconducting layers by the vapor phase method and the two liquid phase steps of forming respective liquid phase growth superconducting layers by the liquid phase method are performed alternately. Alternatively, the formation of the superconducting layer by the vapor phase method and the formation of the superconducting layer by the liquid phase method may be performed alternately and each may be performed twice or more.

In connection with the present embodiment, the case is illustrated where superconducting layer 6 is the uppermost layer among the layers constituting the superconducting thin film material. Alternatively, after superconducting layer 6 is formed (step S6), another superconducting layer may be formed to be in contact with superconducting layer 6. This superconducting layer may be formed by a vapor phase method or may be formed by a liquid phase method. In this way, on superconducting layer 6 having excellent surface smoothness, another superconducting layer can be formed to increase the thickness of the superconducting thin film material.

Third Embodiment

Figure 7:
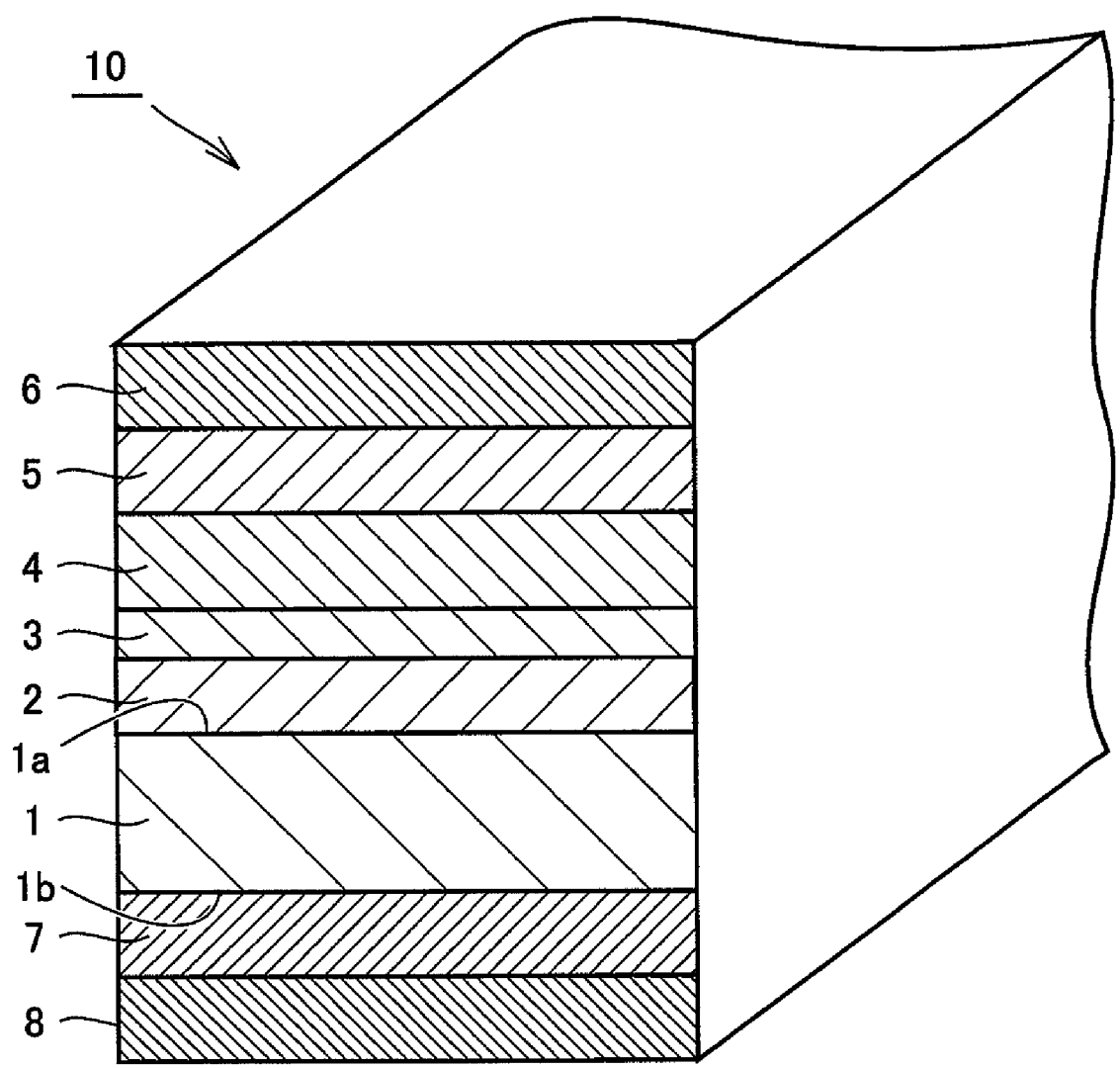
FIG. 7 is a partial cross-sectional perspective view schematically showing a structure of a superconducting thin film material in a third embodiment of the present invention.

FIG. 7 is a partial cross-sectional perspective view schematically showing a structure of a superconducting thin film material in a third embodiment of the present invention. Referring to FIG. 7, superconducting thin film material 10 in the present embodiment further includes a superconducting layer 7 which is a rear surface side vapor phase growth superconducting layer and a superconducting layer 8 which is a rear surface side liquid phase growth superconducting layer. Superconducting layer 7 and superconducting layer 8 are layered on each other on a rear surface 1b side of a metal substrate 1. Superconducting layer 7 and superconducting layer 8 are made of substantially the same material and have an RE123 composition for example.

A method of manufacturing the superconducting thin film material in the present embodiment will now be described.

Figure 8:
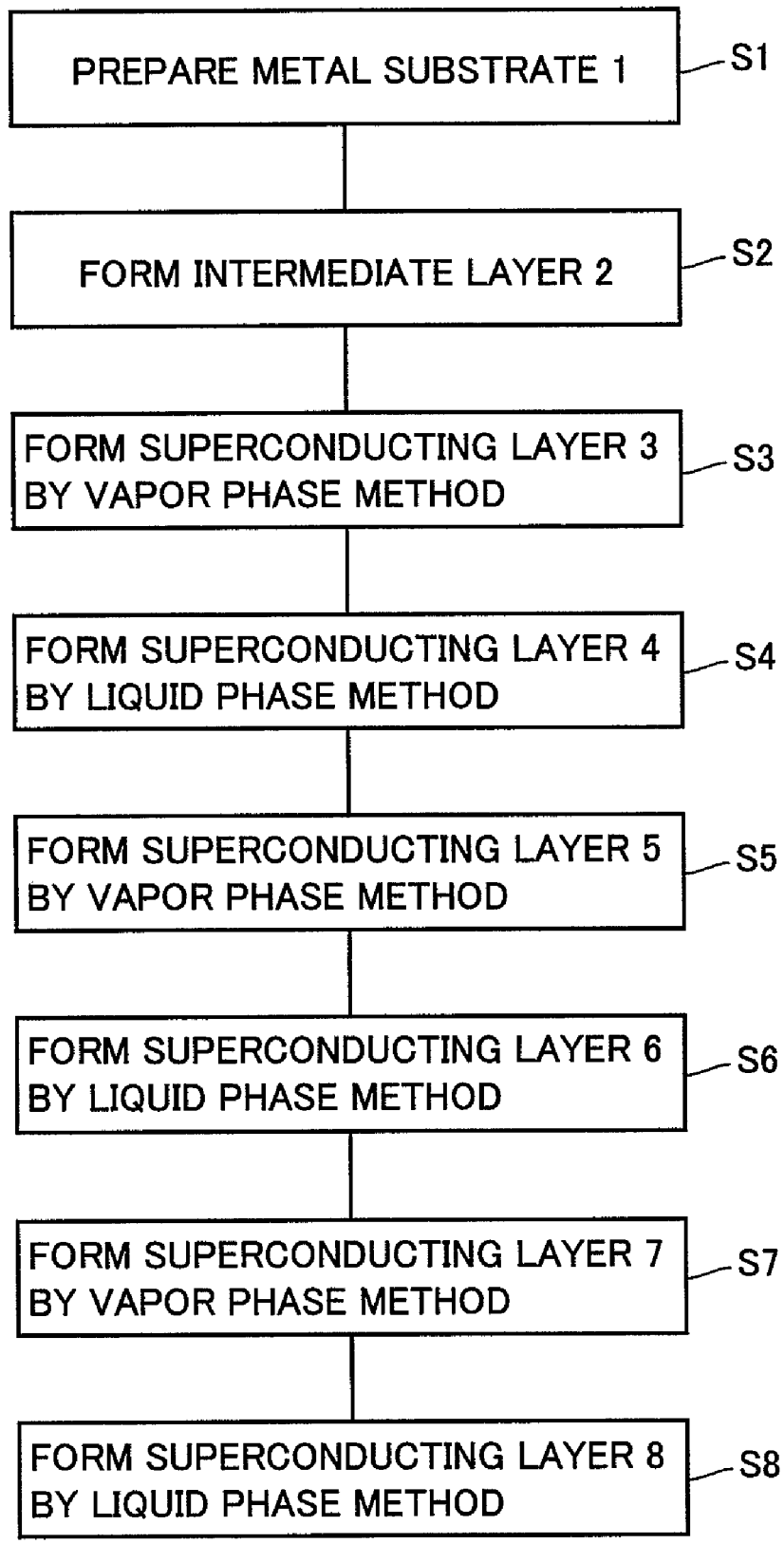
FIG. 8 is a flowchart showing a method of manufacturing the superconducting thin film material in the third embodiment of the present invention.

FIG. 8 is a flowchart illustrating a method of manufacturing the superconducting thin film material in the third embodiment of the present invention. Referring to FIGS. 7 and 8, according to the method of manufacturing the superconducting thin film material in the present embodiment, after superconducting layer 6 is formed (step S6), superconducting layer 7 having an RE123 composition for example is formed by a vapor phase method to be in contact with rear surface 1b of metal substrate 1 (step S7). The vapor phase method used for forming superconducting layer 7 is for example laser deposition method, sputtering method or electron beam evaporation method. Subsequently, superconducting layer 8 having an RE123 composition for example is formed by a liquid phase method such as MOD method to be in contact with superconducting layer 7 (step S8). Through the above-described steps, superconducting thin film material 10 is completed.

Regarding superconducting thin film material 10 and the manufacturing method thereof in the present embodiment, those effects similar to the effects of the superconducting thin film material and the manufacturing method thereof in the first embodiment can be achieved. In addition, since respective superconducting thin film materials can be formed on both of front surface 1a side and rear surface 1b side of metal substrate 1, the number of current paths of the superconducting wire can be increased and the critical current density and the critical current value can further be improved.

The timing at which the successive steps of forming superconducting layer 7 (step S7) and forming superconducting layer 8 (step S8) are performed may be any timing. For example, these steps may be performed immediately after metal substrate 1 is prepared (step S1), or immediately after superconducting layer 3 is formed (step S2). Further, between metal substrate 1 and superconducting layer 7, an intermediate layer may be formed.

In connection with the first to third embodiments, the case is illustrated where a superconducting layer made of a material having an RE123 composition is formed. The present invention, however, is not limited to this case and is applicable as well to a method of manufacturing a superconducting layer of another material such as bismuth-based material for example.

Further, in connection with the first to third embodiments, the case is illustrated where intermediate layer 2 is formed on front surface 1a of metal substrate 1. Intermediate layer 2, however, may not be formed. In this case, superconducting layer 3 is formed to be in contact with metal substrate 1.

EXAMPLE 1

In this example, respective superconducting thin film materials for comparative example A, present invention's example B, present invention's example C, comparative example D and comparative example E were each manufactured, and the critical current value and the surface smoothness were measured.

Comparative Example A

On an Ni alloy substrate, an intermediate layer made of a metal oxide was formed using the vapor phase deposition method. Surface roughness Ra of the surface of the intermediate layer was 5 nm. Subsequently, on the intermediate layer, a superconducting layer made of $HoBa_2Cu_3O_x$ (HoBCO) was formed to a thickness of 0.2 μm using the PLD method.

Present Invention's Example B

First, a structure similar to that of Comparative Example A was produced. Subsequently, on the superconducting layer, a superconducting layer made of $HoBa_2Cu_3O_x$ (HoBCO) was formed to a thickness of 0.3 um using the MOD method. The total thickness of the superconducting layer was thus 0.5 μm.

Present Invention's Example C

First, a structure similar to that of Present Invention's Example B was produced. Subsequently, on the superconducting layer, a superconducting layer made of $HoBa_2Cu_3O_x$ (HoBCO) was formed to a thickness of 0.3 μm using the PLD method. The total thickness of the superconducting layer was thus 0.8 μm.

Comparative Example D

First, a structure similar to that of Comparative Example A was produced. Subsequently, on the superconducting layer, a superconducting layer made of $HoBa_2Cu_3O_x$ (HoBCO) was formed to a thickness of 0.3 μm using the PLD method. The total thickness of the superconducting layer was thus 0.5 μm.

Comparative Example E

First, a structure similar to that of Comparative Example D was produced. Subsequently, on the superconducting layer, a superconducting layer made of $HoBa_2Cu_3O_x$ (HoBCO) was formed to a thickness of 0.3 μm using the PLD method. The total thickness of the superconducting layer was thus 0.8 μm.

Figure 9:
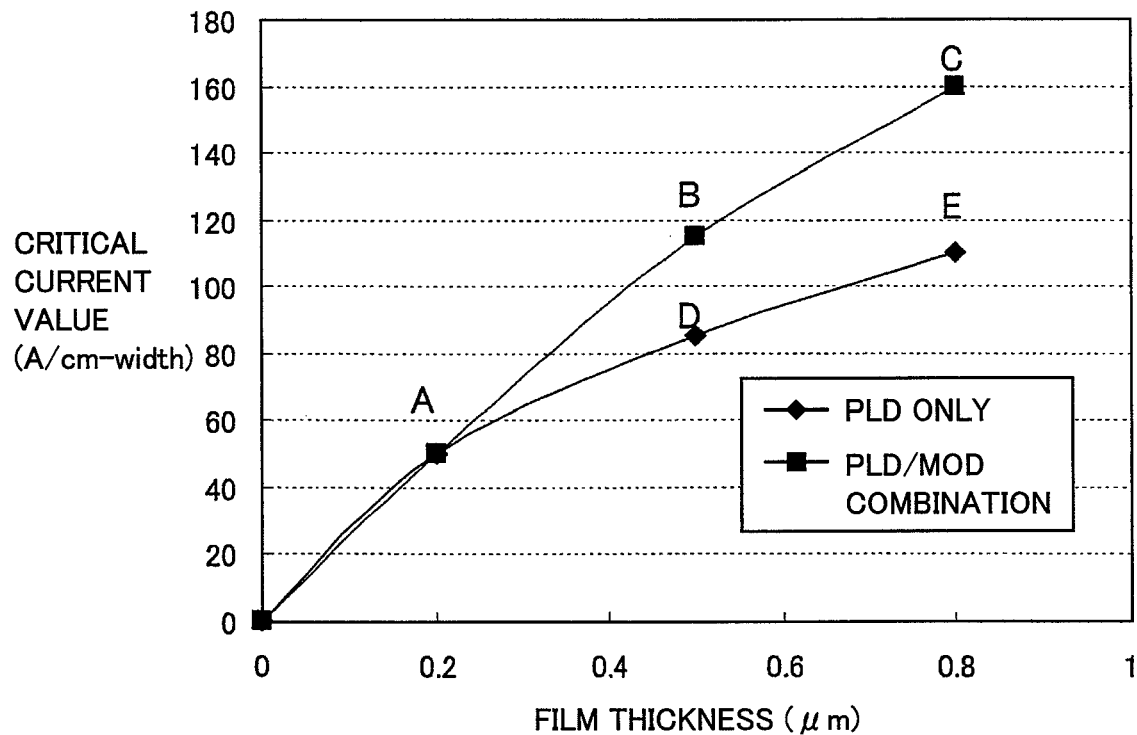
FIG. 9 shows a relation between the thickness of a superconducting layer and critical current value Ic in the example 1 of the present invention.
Figure 10:
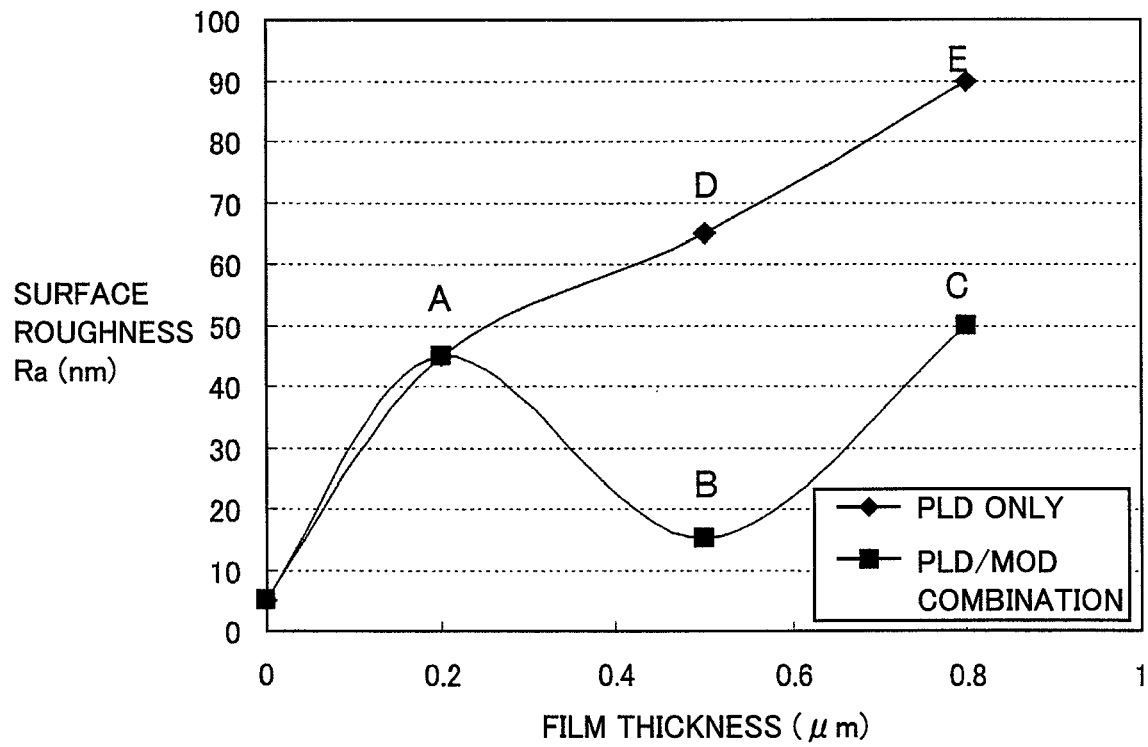
FIG. 10 shows a relation between the thickness of a superconducting layer and surface roughness Ra in the example 1 of the present invention.

The critical current value per cm width and surface roughness Ra measured for each of Comparative Example A, Present Invention's Example B, Present Invention's Example C, Comparative Example D and Comparative Example E are shown in Table 1 and FIGS. 9 and 10. Surface roughness Ra means an arithmetic mean roughness Ra defined by the JIS (Japanese Industrial Standards).

TABLE 1

| Sample | Comparative Example A | Present Invention's Example B | Present Invention's Example C | Comparative Example D | Comparative Example E |
| --- | --- | --- | --- | --- | --- |
| Film Deposition Method | PLD | PLD + MOD | PLD + MOD + PLD | PLD + PLD | PLD + PLD + PLD |
| Total Thickness of Superconducting Layer (μm) | 0.2 | 0.5 | 0.8 | 0.5 | 0.8 |
| Critical Current (A/cm-width) | 50 | 115 | 160 | 85 | 110 |
| Surface Roughness Ra (nm) | 45 | 15 | 50 | 65 | 90 |

Referring to Table 1 and FIGS. 9 and 10, as seen from a comparison between Comparative Example A, Present Invention's Example B and Present Invention's Example C, the critical current value is larger as the thickness of the superconducting layer is larger. As also seen from a comparison between Comparative Example A, Comparative Example D and Comparative Example E, the critical current value is also larger as the thickness of the superconducting layer is larger. This is for the reason that the cross-sectional area where the current flows increases as the thickness of the superconducting layer increases. As seen from a comparison between Present Invention's Example B and Comparative Example D, regardless of the fact that Present Invention's Example B and Comparative Example D have the same thickness, Present Invention's Example B has the smaller surface roughness Ra and the larger critical current value. As also seen from a comparison between Present Invention's Example C and Comparative Example E, regardless of the fact that Present Invention's Example C and Comparative Example E have the same thickness, Present Invention's Example C has the smaller surface roughness Ra and the larger critical current value. It is seen from the above that the surface smoothness of the superconducting layer can be improved and the critical current density and the critical current value can be improved by forming the superconducting layer by a liquid phase method after forming the superconducting layer by a vapor phase method, according to the present invention's examples.

It should be construed that embodiments disclosed above are by way of illustration in all respects, not by way of limitation. It is intended that the scope of the present invention is defined by claims, not by the embodiments and examples above, and includes all modifications and variations equivalent in meaning and scope to the claims.

Industrial Applicability

The present invention is appropriate for a superconducting device including, for example, superconducting fault current limiter, magnetic field generating device, superconducting cable, superconducting busbar and superconducting coil and the like.

The invention claimed is:

1. A method of manufacturing a superconducting thin film material, comprising:

n vapor phase steps, n is an integer of at least 2, each for forming a vapor phase growth superconducting layer by a pulsed laser deposition method; and n liquid phase steps each for forming a liquid phase growth superconducting layer by a metal organic deposition method, wherein in a first vapor phase step of said n vapor phase steps, a first vapor phase growth superconducting layer is formed, in a first liquid phase step of said n liquid phase steps, a first liquid phase growth superconducting layer is formed so that the first liquid phase growth superconducting layer is in contact with said first vapor phase growth superconducting layer, in a k-th vapor phase step, k is an integer satisfying n≧k≧2, of said n vapor phase steps, a k-th vapor phase growth superconducting layer is formed so that the k-th vapor phase growth superconducting layer is in contact with a (k−1)-th liquid phase growth superconducting layer, and in a k-th liquid phase step of said n liquid phase steps, a k-th liquid phase growth superconducting layer is formed so that the k-th liquid phase growth superconducting layer is in contact with the k-th vapor phase growth superconducting layer.

2. The method of manufacturing the superconducting thin film material according to claim 1, further comprising the step of forming a superconducting layer after said n-th liquid phase step so that the superconducting layer is in contact with said n-th liquid phase growth superconducting layer.

\* \* \* \* \*